United States Patent
McShane et al.

(10) Patent No.: US 8,680,674 B2
(45) Date of Patent: Mar. 25, 2014

(54) METHODS AND STRUCTURES FOR REDUCING HEAT EXPOSURE OF THERMALLY SENSITIVE SEMICONDUCTOR DEVICES

(75) Inventors: Michael B. McShane, Austin, TX (US); Kevin J. Hess, Austin, TX (US); Perry H. Pelley, Austin, TX (US); Tab A. Stephens, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 44 days.

(21) Appl. No.: 13/485,886

(22) Filed: May 31, 2012

(65) Prior Publication Data

US 2013/0320480 A1 Dec. 5, 2013

(51) Int. Cl.
*H01L 23/34* (2006.01)
*H01L 23/52* (2006.01)
*H01L 23/48* (2006.01)
*H01L 23/02* (2006.01)
*H01L 21/48* (2006.01)

(52) U.S. Cl.
USPC .......... 257/724; 257/774; 257/706; 257/680; 438/122

(58) Field of Classification Search
USPC ................ 257/680, 706, 724, 774; 438/122
See application file for complete search history.

(56) References Cited

U.S. PATENT DOCUMENTS

| | | | |
|---|---|---|---|
| 6,190,943 B1 | 2/2001 | Lee et al. | |
| 6,689,638 B2 | 2/2004 | Lin et al. | |
| 7,339,267 B2 | 3/2008 | Thompson et al. | |
| 7,446,407 B2* | 11/2008 | Lin et al. | 257/704 |
| 7,750,459 B2* | 7/2010 | Dang et al. | 257/691 |
| 7,935,571 B2 | 5/2011 | Ramiah et al. | |
| 2006/0131740 A1* | 6/2006 | Kawabata et al. | 257/723 |
| 2007/0158787 A1* | 7/2007 | Chanchani | 257/619 |
| 2010/0213600 A1* | 8/2010 | Lau et al. | 257/693 |

OTHER PUBLICATIONS

Kofol, J.S., et al., "A Backside Via Process for Thermal Resistance Improvement Demonstrated Using GaAs HBTs", IEEE, GaAs IC Symposium, pp. 267-270, 1992.
Maheshwary, R., "3D Stacking: EDA Challenges & Opportunities", Sematech Symposium, Tokyo, Japan, Sep. 24, 2009.
Cismaru, C., et al., "Balancing Electrical and Thermal Device Characteristics—Thru Wafer Vias vs. Backside Thermal Vies", Skyworks Solutions, Inc., CS MANTECH Conference, Palm Springs, California, USA, May 16-19, 2011.
Clarke, H.A., et al., "Thermal Effect of TSVs in 3D Die-Stacked Integrated Circuits", 2011 14th Euromicro Conference on Digital System Design, IEEE, pp. 503-508, 2011.

* cited by examiner

*Primary Examiner* — Luan C Thai
(74) *Attorney, Agent, or Firm* — Mary Jo Bertani

(57) ABSTRACT

A semiconductor device comprises an integrated circuit (IC) die having a top side and a back side. The circuit substrate includes a heat source circuit, a heat sensitive circuit, a package substrate coupled to the top side of the circuit substrate, and a plurality of thermally conductive through-silicon vias (TSVs) formed from the back side of the circuit substrate to near but not through the top side of the circuit substrate.

20 Claims, 2 Drawing Sheets

METHODS AND STRUCTURES FOR REDUCING HEAT EXPOSURE OF THERMALLY SENSITIVE SEMICONDUCTOR DEVICES

BACKGROUND

1. Field

This disclosure relates generally to semiconductor devices, and more specifically, to reducing heat exposure of thermally sensitive semiconductor devices.

2. Related Art

Thermally sensitive semiconductor components may be sensitive to heat transferred from neighboring components on a die even if the devices do not generate much heat themselves. For example, transistors in a Double Data Rate type 3 (DDR3) Random Access Memory (RAM) memory die may be sensitive to heat from neighboring sense amps, write, and pre-charge circuits. As the temperature of the transistors increases, the transistors leak current and the refresh rate of the transistors must be increased to prevent the transistors from losing the data being stored. Increased refresh rates use more power than lower refresh rates. As circuit substrate are designed with ever increasing functionality and speed requirements, it is desirable to find ways to reduce power consumption as well as reduce/remove heat generated by the die.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Embodiments of methods and semiconductor devices disclosed herein provide a cost effective solution using thermally conductive through-silicon vias (TSVs) that are placed between heat source circuits and heat sensitive circuits or elements on a circuit substrate to protect the heat sensitive circuits from circuits that generate heat.

Figure 1:
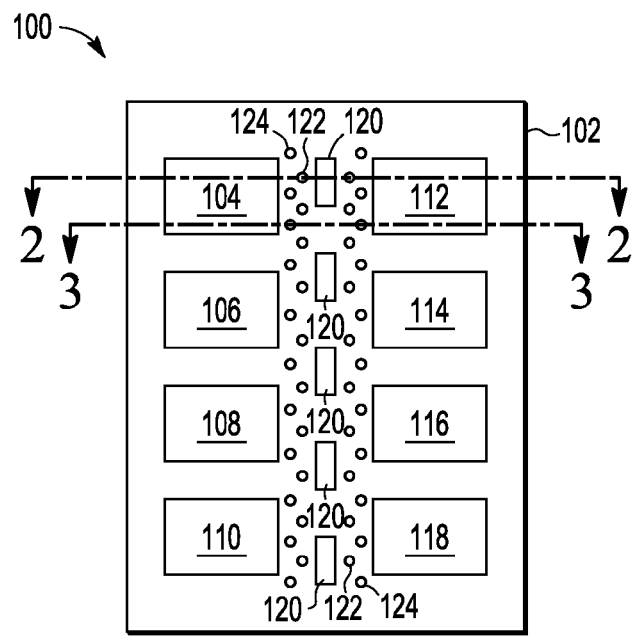
FIG. 1 shows a top view of an embodiment of a semiconductor die in accordance with the present invention.

FIG. 1 shows a top view of an embodiment of a back side of semiconductor die 100 in accordance with the present invention that can include a circuit substrate 102 with one or more heat source circuits 120, one or more heat sensitive circuits 104-118, and thermally conductive blind TSVs 122 placed between the heat source circuit(s) 120 and the heat sensitive circuit(s) 104-118. The blind TSVs 122 help prevent at least some of the heat from the heat source circuit(s) 120 from affecting the heat sensitive circuit(s) 104-118.

As an example of a use for TSVs 122, semiconductor die 100 can be Double Data Rate type 3 (DDR3) Random Access Memory (RAM) memory die that is used to store data in a computer processing system (not shown). In a DDR3 RAM memory device, heat sensitive devices 104-118 can be any type of dynamic random access memory (DRAM) bit cells that are used to store data in a computer processing system. The DDR3 memory device can also include heat source circuits 120 such as sense amps, write circuits, pre-charge circuits, I/O circuits and/or other circuits that generate heat. In a Double Data Rate type 3 (DDR3) Random Access Memory (RAM), some heat source circuits 120 can be positioned along a center spine of die 100 with the heat sensitive circuits 104-118 bit cells arrays implemented on one or both sides or the center spine on the memory die. As the bit cells are exposed to increased temperature generated by heat source circuits 120, they begin to leak current and over time lose data. The data can be refreshed at higher frequency to restore the charge, but the refresh operation consumes power in situations where it is more desirable to reduce power consumption. In some implementations, heat source circuits 120 such as sense amplifier circuits can be embedded within the arrays of bit cells, which are heat sensitive circuits 104-118 and can be at least partially thermally isolated by thermally conductive TSV's 122 placed between the heat source circuits 120 and the heat sensitive circuits 104-118.

TSVs 122 can be formed in a row or other suitable arrangement between the heat source circuit(s) 120 and the heat sensitive circuit(s) 104-118. TSVs 122 do not extend all the way through circuit substrate 102. In some implementations, TSVs 122 are not connected to any active circuitry. The term "active circuitry" refers to components that are capable of conducting electron flow. TSVs 122 may be indirectly coupled to ground when substrate 102 is grounded. TSVs 122 can be filled with any thermally conductive material or combination of materials such as copper, tungsten, gold, aluminum, and/or silver. Other suitable materials can be used.

In addition to thermally conductive TSVs 122, thermally insulating TSVs 124 can be placed between the thermally conductive TSVs 122 and the heat sensitive circuit(s) 104-118, and/or between thermally conductive TSVs 122 and heat source circuit(s) 120. In other implementations, thermally insulating TSVs 124 can be used instead of thermally conducting TSVs 122. As shown in FIG. 1, thermally insulating TSVs 124 can be formed in a row that is staggered with respect to the row of TSVs 122. The staggered alignment can help maintain the structural integrity of the substrate in which TSVs 122, 124 are formed. Other suitable arrangements of TSVs 122, 124 can be used.

Thermally insulating TSVs 124 can be filled with any suitable thermally insulating material or combination of materials. Examples of insulating materials are silicon dioxide, silicon nitride, silica aerogels, or combinations thereof. Other suitable thermally insulating materials can be used.

TSVs 122, 124 can be referred to as "blind" vias because they do not extend all the way through circuit substrate 102. TSVs 122, 124 can be formed by etching or using a laser to form openings partially through layers of circuit substrate 102, and filling the openings with a respective thermally conductive or insulating material. TSVs 122 can be formed from approximately one micron to approximately 10 microns from heat source circuits 120.

Figure 2:
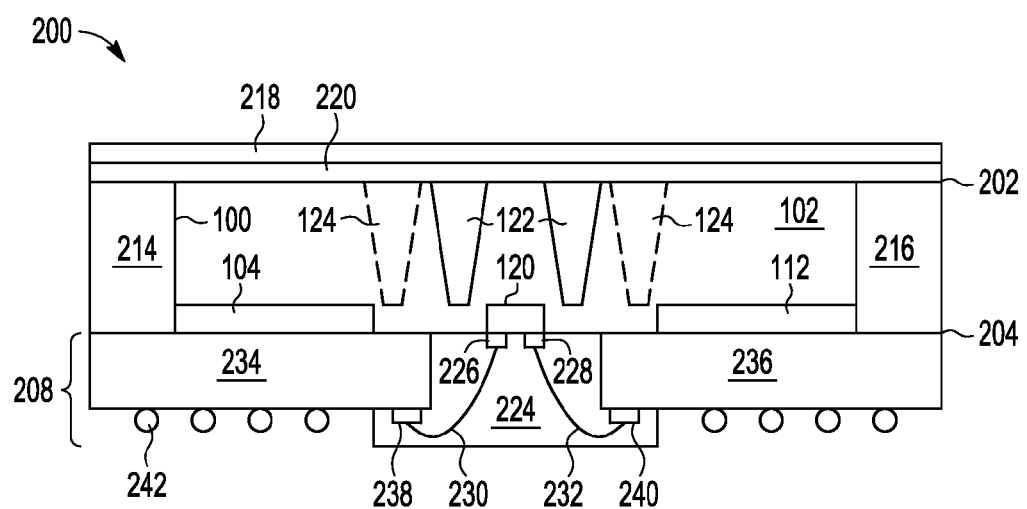
FIG. 2 shows a cross sectional side view of an embodiment of a packaged semiconductor device that includes the semiconductor die of FIG. 1.

FIG. 2 shows a cross sectional side view 1-1 of an embodiment of a packaged semiconductor device 200 that includes the circuit substrate 102 of FIG. 1 with TSVs 122 formed in circuit substrate 102. TSVs 122 extend from a back side 202 of semiconductor die 100 to near, but not through, a top side 204 of semiconductor die 100. Note that thermally insulating TSVs 124 shown in dashed lines in FIG. 2 are further discussed in connection with FIG. 3 herein. One or more TSVs 122 are located between heat source circuit 120 and heat sensitive circuits 104, 112. Heat source circuits 120 and heat sensitive circuits 104, 112 are located at the top side 204 of semiconductor die 100. Heat sensitive circuit 104 is positioned on one side of one of thermally conductive TSVs 122, while heat source circuit 120 is positioned between first and second TSVs 122. Another heat sensitive circuit 112 is positioned on the other side of the second TSV 122.

Encapsulant sections 214, 216 are positioned around the periphery of semiconductor die 100. Heat source circuit 120 includes one or more circuits that generate heat such as a sense amp circuit, a memory cell write circuit, a memory cell pre-charge circuit, I/O circuit or other heat-generating device.

Packaged semiconductor device 200 can include a thermally conductive heat spreader 218 attached to the back side 202 of semiconductor die 100 using a layer of thermally conductive adhesive 220 or other suitable fastening mechanism may be used. Heat spreader 218 helps dissipate heat conducted away from heat source circuits 120 by TSVs 122. Heat spreader 218 can be formed of any suitable thermally conductive material or combination of materials such as copper, tungsten, gold, aluminum, and/or silver. In other embodiments, heat spreader 218 may be formed of thermally conductive, electrically insulating materials, such as boron nitride, aluminum nitride, and/or combinations thereof. Other suitable materials can be used.

Device 200 can include die 100 attached or mounted on a suitable package substrate such as the window ball grid array (BGA) substrate 208 shown in FIG. 2. Window BGA substrate 208 can include substrate sections 234, 236 and encapsulant 224 in an opening in the central portion of the substrate 208 that is referred to as a window. Wire bonds 230 and 232 can be formed through the window to connect electrically conductive contacts or pads 226, 228 on heat source circuitry 120 to conductive contacts 238, 240 on respective substrate sections 234, 236. Encapsulant 224 fills the window to protect wire bonds 230, 232. An array of electrically conductive bumps 242 are formed on the bottom of BGA substrate 208 and can be used to attach semiconductor device 200 to another substrate such as a printed circuit board.

Semiconductor die 100 can include one or more metal layers (not shown), and one or more insulating layers (not shown) between the metal layers that form electronic circuitry such as transistors, sense amps, pre-charge circuits, write circuits, and I/O circuits. The top of the thermally conductive TSVs 122 can be exposed on the back side 202 of the die 100 so that TSVs 122 can conduct heat to heat spreader 218.

Thermally conductive TSVs 122 can be filled with copper, tungsten, gold, aluminum, silver, and/or other thermally conductive material. In other embodiments, TSVs 122 may be formed of thermally conductive, electrically insulating materials, such as boron nitride, aluminum nitride, and/or combinations thereof. Other suitable materials can be used.

TSVs 122 help prevent heat source circuitry 120 from affecting the operation of heat sensitive circuitry 104, 112.

Figure 3:
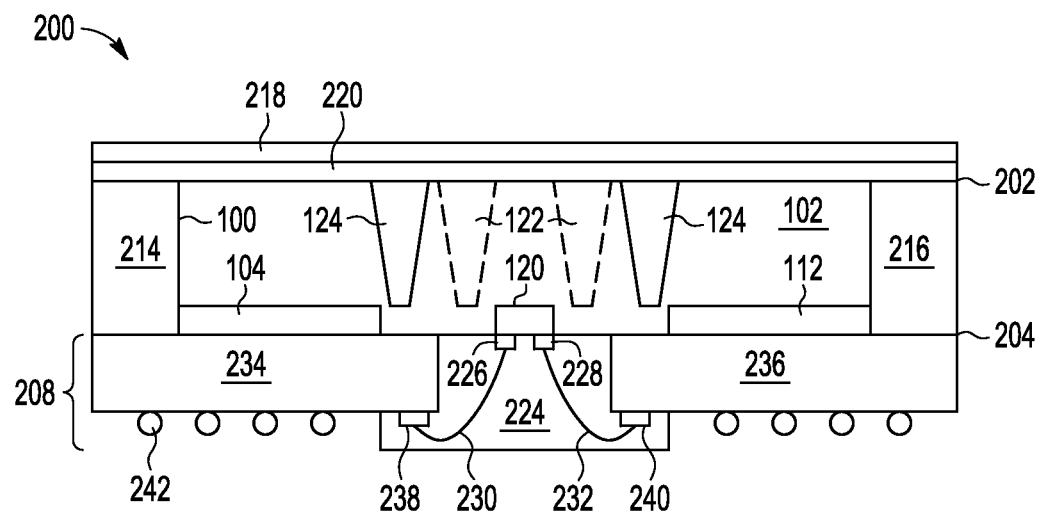
FIG. 3 shows another cross sectional side view of the packaged semiconductor device of FIG. 2 that includes the semiconductor die of FIG. 1.

FIG. 3 shows another cross sectional side view 2-2 of the packaged semiconductor device 200 with thermally insulating TSVs 124 formed in circuit substrate 102. TSVs 124 extend from the back side 202 of semiconductor die 100 to near the top side 204 of semiconductor die 100. Thermally conductive TSVs 122 are shown in dashed lines to indicate that TSVs 122 are staggered with respect to thermally insulating TSVs 124. Insulating TSVs 124 are positioned between conductive TSVs 122 and the heat sensitive circuits 104, 112. Conductive TSVs 122 and insulating TSVs 124 do not extend all the way from back side 202 to the top side 204 of semiconductor die 100 and heat source circuits 120. Instead conductive TSVs 122 and insulating TSVs 124 extend through only a portion of semiconductor die 100 and are not coupled to any active circuitry.

Insulating TSVs 124 can be placed between thermally conductive TSVs 122 and heat sensitive circuit(s) 104, 112. Thermally conductive TSVs 122 can be formed between thermally insulating TSVs 124 and heat source circuitry 120 or other suitable locations. Conductive TSVs 122 and insulating TSVs 124 can be formed in one or more respective rows and/or interspersed among each other. Row(s) of conductive TSVs 122 can be staggered with respect to one or more rows of the thermally insulating TSVs 124.

Thermally insulating TSVs 124 can be filled with suitable thermally insulating material or combination of materials. Examples of insulating materials are silicon dioxide, silicon nitride, silica aerogels, or combinations thereof. Other suitable thermally conductive materials can be used.

By now it should be appreciated that although a DDR3RAM has been used as an example herein, it is anticipated that TSVs 122 and/or TSVs 124 can be used in any semiconductor device where it is desirable to prevent heat generated by heat source circuits 120 from affecting operation of heat sensitive circuits 104-118.

In some embodiments, a semiconductor device 200 can comprise a heat source circuit 120, a heat sensitive circuit 104-118, and a plurality of thermally conductive blind through-silicon vias (TSVs) 122 placed between the heat source circuit 120 and the heat sensitive circuit 104-118. The TSVs help prevent at least some of the heat generated in the heat source circuit 120 from affecting the heat sensitive circuit 104-118. The TSVs do not extend all the way through a circuit substrate 102 in which the conductive TSVs 122 are formed, and are not connected to any circuitry.

In another aspect, a heat sink can be coupled to the plurality of TSVs.

In another aspect, a plurality of thermally insulating TSVs 124 can be placed between the thermally conductive blind TSVs 122 and the heat sensitive circuit 104-118.

In another aspect, the thermally conductive blind TSVs 122 can be formed in a row and the row can be staggered with respect to a row of the thermally insulating TSVs 124.

In another aspect, the thermally insulating TSVs 124 can be filled with one of a group of materials consisting of: a silicon dioxide and a silicon nitride.

In another aspect, the heat source circuit 120, the heat sensitive circuit 104-118 and the TSVs can be included in circuit substrate 102 and a top side 204 of the circuit substrate 102 can be coupled to the window BGA substrate 208.

In another aspect, the heat sensitive circuit 104-118 can be a dynamic random access memory cell and the heat source circuit 120 is at least one of the group consisting of: a sense amp circuit, a memory cell write circuit, and a memory cell pre-charge circuit.

In another aspect, the thermally conductive blind TSVs 122 can be filled with one from a group of materials consisting of: copper, tungsten, gold, aluminum, and silver.

In another embodiment, a semiconductor device 200 can comprise an integrated circuit (IC) module 206 having a top side 204 and a back side 202. The circuit substrate 102 can include a circuit substrate 102 with a heat source circuit 120 and a heat sensitive circuit 104-118. A package substrate 208 can be coupled to the top side 204 of the circuit substrate 102. A plurality of thermally conductive through-silicon vias (TSVs) 122 can be formed from the back side 202 of the circuit substrate 102 to near but not through the top side 204 of the semiconductor die. The TSVs do not contact other internal circuitry of the semiconductor die.

In another aspect, a top of the thermally conductive TSVs 122 can be exposed on a back side of the semiconductor die. The semiconductor device 200 can further include a heat spreader coupled or attached to the top of the thermally conductive TSVs.

In another aspect, a plurality of thermally insulating TSVs 124 can be placed through only a subset of metal layers and insulating layers in the circuit substrate 102 and placed between the heat source circuit 120 and the heat sensitive circuit 104-118.

In another aspect, the thermally conductive TSVs 122 can be formed in a row and the row can be staggered with respect to a row of the thermally insulating TSVs 124.

In another aspect, the thermally insulating TSVs 124 can be filled with one of a group of materials consisting of: a silicon dioxide and a silicon nitride.

In another aspect, the package substrate 208 can be a window ball grid array (BGA) substrate and the circuit substrate 102 can be wirebonded to interconnects on the window BGA substrate.

In another aspect, the heat sensitive circuit 104 can be a dynamic random access memory cell and the heat source circuit 120 can be at least one of the group consisting of: a sense amp circuit, a memory cell write circuit, and a memory cell pre-charge circuit.

In another aspect, the thermally conductive TSVs 122 can be filled with one of a group of materials consisting of: copper, tungsten, gold, aluminum, silver, boron nitride, and aluminum nitride.

In another aspect, the thermally conductive TSVs 122 can help prevent heat from the heat source circuit 120 from affecting operation of the heat sensitive circuit 104-118.

In another embodiment, a method can comprise choosing locations for a plurality of thermal vias 122, 124 in the back side 202 of the circuit substrate 102 so that the thermal vias do not extend to a top side 204 of the circuit substrate 102, are not connected to other circuitry in the circuit substrate 102, and are placed between heat source circuit 120 and heat sensitive circuit 104-118 in the circuit substrate 102. The thermal vias 122, 124 are then formed and filled. A back side 202 of a circuit substrate 102 is electrically coupled to a package substrate 208.

In another aspect, the thermal vias are at least one of the group consisting of: thermally conductive vias 122 and thermally insulating vias 124.

In another aspect, the method can further comprise attaching a heat spreader 218 to the packaged semiconductor device 200.

Because the apparatus implementing the present disclosure is, for the most part, composed of electronic components and circuits known to those skilled in the art, circuit details will not be explained in any greater extent than that considered necessary as illustrated above, for the understanding and appreciation of the underlying concepts of the present disclosure and in order not to obfuscate or distract from the teachings of the present disclosure.

Although the disclosure is described herein with reference to specific embodiments, various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A semiconductor device, comprising:
   a heat source circuit;
   a heat sensitive circuit;
   a plurality of thermally conductive blind through-silicon vias (TSVs) placed between the heat source circuit and the heat sensitive circuit, wherein the TSVs:
   help prevent at least some of the heat from the heat source circuit from affecting the heat sensitive circuit,
   extend only partially through a circuit substrate in which the TSVs are formed, and
   are not connected to any active circuitry.

2. The semiconductor device of claim 1, further comprising:
   a heat sink coupled to the plurality of TSVs.

3. The semiconductor device of claim 1, further comprising:
   a plurality of thermally insulating TSVs placed between the thermally conductive blind TSVs and the heat sensitive circuit.

4. The semiconductor device of claim 3, wherein the thermally conductive blind TSVs are formed in a row and the row is staggered with respect to a row of the thermally insulating TSVs.

5. The semiconductor device of claim 3, wherein the thermally insulating TSVs are formed with one of a group of materials consisting of: a silicon dioxide, a silicon nitride, and an aerogel.

6. The semiconductor device of claim 1, further comprising:
   a window ball grid array (BGA) substrate, wherein the heat source circuit, the heat sensitive circuit and the TSVs are included in the circuit substrate and a top side of the circuit substrate is coupled to the window BGA substrate.

7. The semiconductor device of claim 1, wherein the heat sensitive circuit is a dynamic random access memory cell and the heat source circuit is at least one of a group consisting of: a sense amp circuit, a memory cell write circuit, and a memory cell pre-charge circuit.

8. The semiconductor device of claim 3, wherein the thermally conductive blind TSVs are formed with one from a group of materials consisting of: copper, tungsten, gold, aluminum, silver, boron nitride, and aluminum nitride.

9. A semiconductor device, comprising:
   a circuit substrate having a top side and a back side, the circuit substrate including:
   a heat source circuit;
   a heat sensitive circuit;
   a package substrate coupled to the top side of the circuit substrate;

a plurality of thermally conductive through-silicon vias (TSVs) formed from the back side of the circuit substrate to near but not through the top side of the circuit substrate, wherein the TSVs do not contact active circuitry internal or external to the circuit substrate.

10. The semiconductor device of claim 9, wherein a top of the thermally conductive TSVs are exposed on one side of the circuit substrate, the semiconductor device further comprising:

a heat spreader coupled to the top of the thermally conductive TSVs.

11. The semiconductor device of claim 9, further comprising:

a plurality of thermally insulating TSVs formed through only a subset of metal layers and insulating layers in the circuit substrate and placed between the heat source circuit and the heat sensitive circuit.

12. The semiconductor device of claim 11, wherein the thermally conductive TSVs are formed in a row and the row is staggered with respect to a row of the thermally insulating TSVs.

13. The semiconductor device of claim 11, wherein the thermally insulating TSVs are formed with one of a group of materials consisting of: a silicon dioxide, a silicon nitride, and an aerogel.

14. The semiconductor device of claim 9, further comprising:

the package substrate is a window ball grid array (BGA) substrate and the circuit substrate is coupled to the window BGA with wirebonds.

15. The semiconductor device of claim 9, wherein the heat sensitive circuit is a dynamic random access memory cell and the heat source circuit is at least one of a group consisting of: a sense amp circuit, a memory cell write circuit, and a memory cell pre-charge circuit.

16. The semiconductor device of claim 11, wherein the thermally conductive TSVs are formed with one from a group of materials consisting of: copper, tungsten, gold, aluminum, silver, boron nitride, and aluminum nitride.

17. The semiconductor device of claim 9, wherein the thermally conductive TSVs are placed within a range of 1 to 10 microns of the heat source circuit.

18. A method comprising:

choosing locations for a plurality of thermal vias in the back side of a circuit substrate, so that the thermal vias extend only partially to a top side of the circuit substrate, are not connected to active circuitry in the circuit substrate, and are placed between heat source circuitry and heat sensitive circuitry in the circuit substrate;

filling the thermal vias; and electrically coupling a top side of the circuit substrate to a package substrate.

19. The method of claim 18, wherein the thermal vias are at least one of the group consisting of: thermally conductive vias and thermally insulating vias.

20. The method of claim 18, further comprising:

applying a layer of thermally conductive adhesive to a back side of the circuit substrate; and attaching a heat sink to the thermally conductive adhesive.

* * * * *